(12) United States Patent
Nakamura et al.

(10) Patent No.: US 9,024,628 B2
(45) Date of Patent: May 5, 2015

(54) STEERING SYSTEM

(71) Applicant: JTEKT Corporation, Osaka-shi, Osaka (JP)

(72) Inventors: Masahide Nakamura, Kashihara (JP); Masafumi Kajitani, Kashiba (JP); Zijin Wu, Shiki-gun (JP); Jianchao Jiang, Shiki-gun (JP)

(73) Assignee: JTEKT Corporation, Osaka (JP)

( * ) Notice: Subject to any disclaimer, the term of this patent is extended or adjusted under 35 U.S.C. 154(b) by 48 days.

(21) Appl. No.: 14/079,456

(22) Filed: Nov. 13, 2013

(65) Prior Publication Data

US 2014/0139207 A1 May 22, 2014

(30) Foreign Application Priority Data

Nov. 20, 2012 (JP) ................. 2012-254078

(51) Int. Cl.
*G01B 7/30* (2006.01)
*G01R 35/00* (2006.01)
*G01P 3/48* (2006.01)
*G01R 33/00* (2006.01)
*B62D 6/10* (2006.01)
*B62D 15/02* (2006.01)

(52) U.S. Cl.
CPC .............. *G01R 33/0017* (2013.01); *B62D 6/10* (2013.01); *B62D 15/0215* (2013.01)

(58) Field of Classification Search
CPC .......................................................... G01B 7/30
USPC ................................................... 324/207.25
See application file for complete search history.

(56) References Cited

U.S. PATENT DOCUMENTS 6,486,658 B2 * 11/2002 Naidu .................... 324/207.21
7,218,100 B1 * 5/2007 Matsumoto et al. ..... 324/207.25

FOREIGN PATENT DOCUMENTS

JP       A-2011-122943       6/2011

* cited by examiner

*Primary Examiner* — Bot Ledynh
(74) *Attorney, Agent, or Firm* — Oliff PLC

(57) ABSTRACT

A steering system includes a steering shaft an electric motor that assists a steering component; a torque detection device that generates a first detection signal according to a steering torque; and a compensation sensor that generates a second detection signal according to a magnetic flux around the steering shaft and its surrounding structure. In the steering system, an output signal, in which an influence of the magnetic field around the steering shaft and its surrounding structure is reduced, is generated based on a signal correction computing equation based on information on correlation between the first detection signal and the second detection signal. Then, in the steering system, the electric motor is driven based on the output signal.

6 Claims, 10 Drawing Sheets

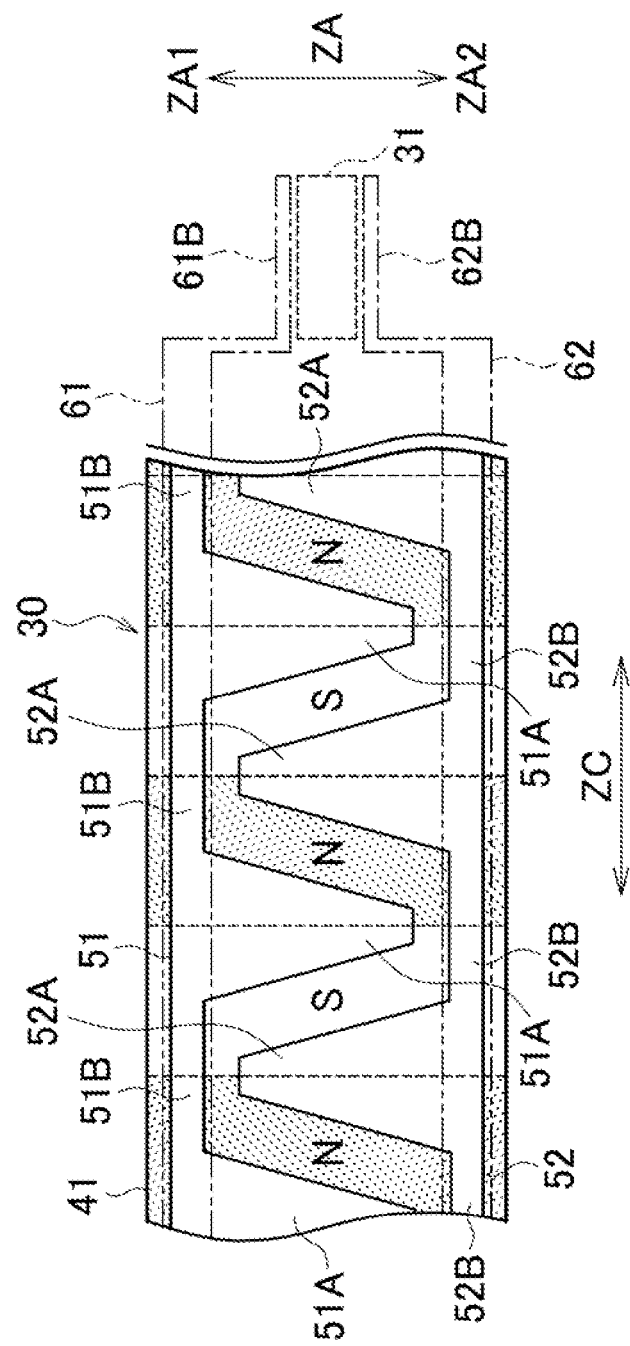

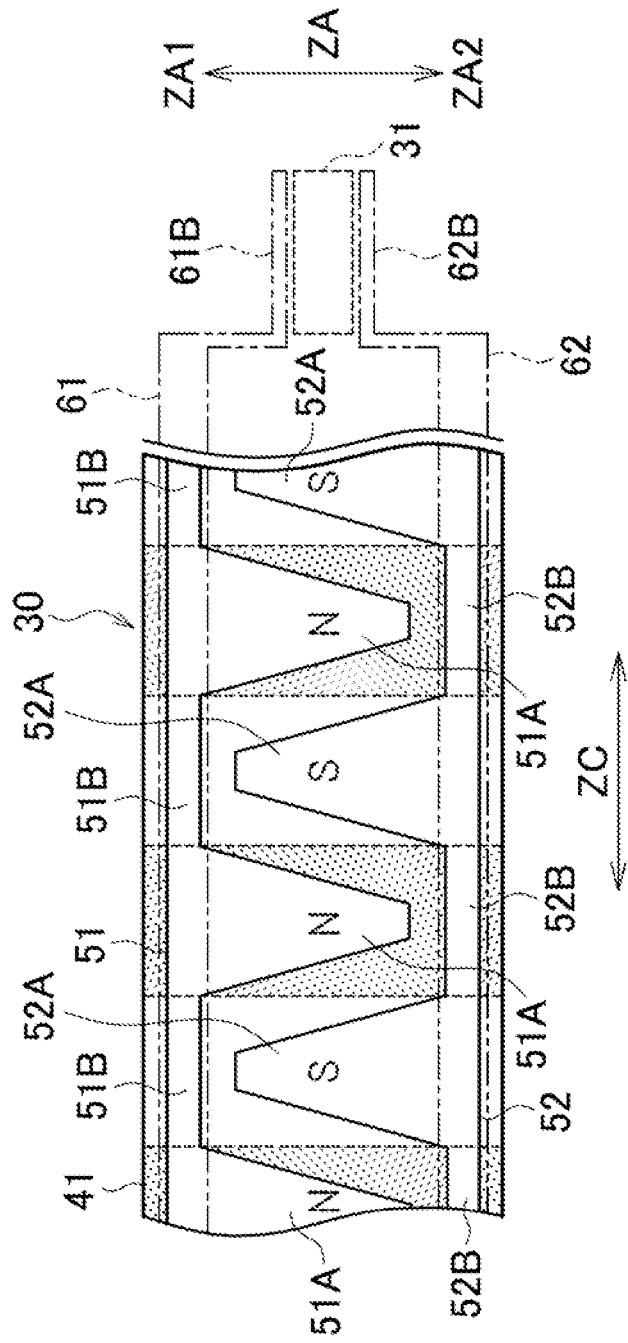

STEERING SYSTEM

INCORPORATION BY REFERENCE

The disclosure of Japanese Patent Application No. 2012-254078 filed on Nov. 20, 2012 including the specification, drawings and abstract, is incorporated herein by reference in its entirety.

BACKGROUND OF THE INVENTION

1. Field of the Invention

The invention relates to a steering system including a magnetic detection device.

2. Description of the Related Art

A conventional steering system includes, as a magnetic detection device, a torque detection device that detects a steering torque applied to a steering wheel. The torque detection device has a configuration in which a steering shaft is inserted in the torque detection device. The torque detection device includes a magnetic detection portion that detects magnetism, and a magnetic shield that restrains earth's magnetism from collecting the magnetic detection portion, by surrounding an outside of the magnetic detection portion. As an example of such a steering system, there is a steering system described in Japanese Patent Application Publication No. 2011-122943 (JP2011-122943 A).

In the conventional steering system, the steering shaft is inserted in the torque detection device, and therefore, it is difficult for the magnetic shield to cover the magnetic detection portion in an axial direction of the steering shaft. Therefore, the earth's magnetism tray affect the magnetic detection portion via the steering shaft. Accordingly, even when the same steering torque is applied to the steering wheel, the torque detection device may detect the steering torque as a different torque. A similar phenomenon also occurs in a magnetic detection device other than the torque detection device, for example, a steering angle detection device that detects a steering angle of the steering wheel.

SUMMARY OF THE INVENTION

In order to deal with the above phenomenon, an object of the invention is to provide a steering system that is able to operate in a state where an influence of earth's magnetism is further suppressed.

A steering system according to an aspect of the invention includes: a steering shaft that rotates due to an operation of a steering component; an electric motor that assists the operation of the steering component by applying, to the steering shaft, a force that rotates the steering shaft; a permanent magnet that rotates together with the steering shaft; a yoke disposed in a magnetic field formed by the permanent magnet such that a relative position of the yoke with respect to the permanent magnet varies; a magnetic detection device including a magnetic detection portion that generates a first detection signal according to a magnetic flux of a magnetic circuit formed by the permanent magnet and the yoke; an output signal generation portion that generates, based on the first detection signal and an external magnetic field including earth's magnetism, an output signal by reducing an influence of the external magnetic field in a first detection signal; and a motor driving portion that drives the electric motor based on the output signal.

In the above-described steering system, the first detection signal is corrected so that the influence of the external magnetic field including the earth's magnetism is reduced. Thus, the output signal to the motor driving portion is a signal in which the influence of the external magnetic field is reduced. Accordingly, the steering system is able to operate in the state where the influence of the earth's magnetism is further suppressed.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 5A is a development view showing a positional relationship between a permanent magnet, and each yoke and each magnetism collecting ring in the torque detection device at a neutral state in the first embodiment;

FIG. 5B is as development view showing the positional relationship between the permanent magnet, and each yoke and each magnetism collecting ring in the torque detection device at a clockwise rotation state in the first embodiment;

DETAILED DESCRIPTION OF EMBODIMENTS

Figure 1:
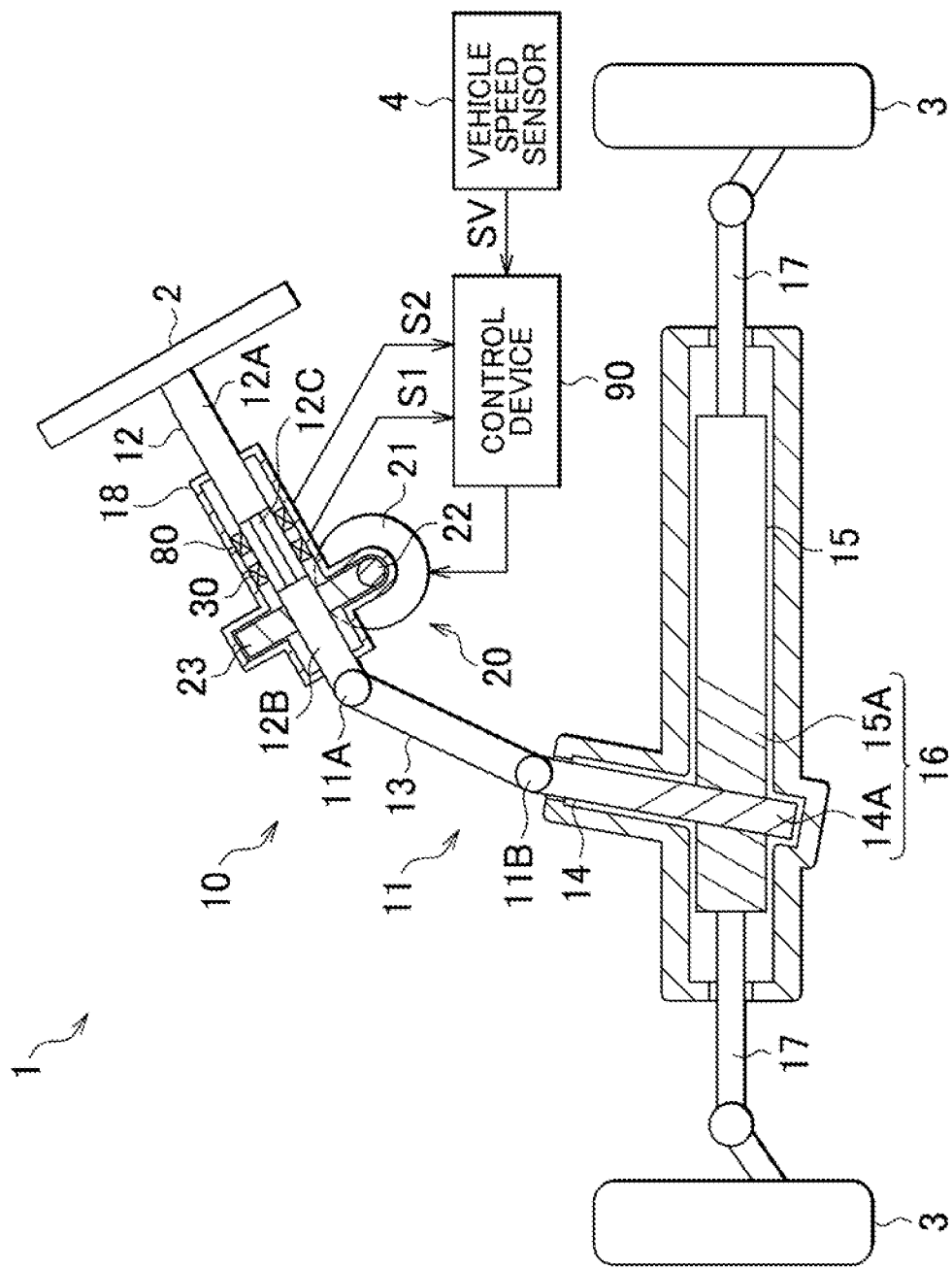
FIG. 1 is a configuration diagram showing the configuration of a steering system according to a first embodiment of the invention.

A first embodiment of the invention will be described. Referring to FIG. 1, the configuration of a steering system 1 will be described. The steering system 1 includes a steering main body 10, an assist device 20, a torque detection device 30 as a magnetic detection device, a compensation sensor 80, and a control device 90. The steering system 1 has a configuration as a column assist type electric power steering system in which an operation of a steering wheel as a steering component 2 is assisted by the assist device 20.

The steering main body 10 includes a steering shaft 11, a rack shaft 15, a rack-and-pinion mechanism 16, two tie rods 17, and a column housing 18. The steering main body 10 has a configuration in which the steering shaft 11 is connected to the rack shaft 15 via the rack-and-pinion mechanism 16.

The steering shaft 11 includes a column shaft 12, an intermediate shaft 13, and a pinion shaft 14. The steering shaft 11 has a configuration in which the column shaft 12 is connected to the intermediate shaft 13 via a ball joint 11A. The steering shaft 11 has a configuration in which the intermediate shaft 13 is connected to the pinion shaft 14 via a hall joint 11B.

The column shaft 12 includes a first shaft 12A, a second shaft 12B, and a torsion bar 12C. The column shaft 12 has a configuration in which the first shaft 12A and the second shaft 12B are connected to each other via the torsion bar 12C. The column shaft 12 is configured such that an end portion of the first shaft 12A is connected to the steering component 2 and an end portion of the second shaft 12B is connected to the intermediate shaft 13 via the ball joint 11A.

The pinion shaft 14 includes a pinion gear 14A. The pinion shaft 14 is configured such that the pinion gear 14A meshes with a rack gear 15A of the rack shaft 15. The rack shaft 15 includes the rack gear 15A. The rack can 15A includes a plurality of rack teeth formed in a predetermined range in a longitudinal direction of the rack shaft 15.

The rack-and-pinion mechanism 16 includes the pinion tear 14A of the pinion shaft 14 and the rack gear 15A of the ma shaft 15. The rack-and-pinion mechanism 16 converts a rotation of the pinion shaft 14 to as reciprocating movement of the rack shaft 15.

The column housing 18 is formed of a metal material. The column housing 18 surrounds an outside of the column shaft 12. The column housing 18 accommodates therein the torque detection device 30, the compensation sensor 80, and a wormshaft 22 and a worm wheel 23 of the assist device 20.

The assist device 20 includes an electric motor 21, the wormshaft 22, and the worm wheel 23. The assist device 20 has a configuration in which the wormshaft 42 is connected to an output shaft of the electric motor 21 so that the output shaft and the wormshaft 22 rotate together. The assist device 20 has a configuration in which the worm wheel 23 meshes with the wormshaft 22. The assist device 20 has a configuration in which the worm wheel 23 is fixed to the column shaft 12. The assist device 20 applies, to the column shaft 12, as three that rotates the column shaft 12 by transmitting a rotation of the electric motor 21 to the column shaft 12 after the speed of the rotation from the electric motor 21 is reduced by the wormshaft 22 and the worm wheel 23. Hereinafter, the force that rotates the column shaft 12 by the electric motor 21 is referred to as an assist force.

The torque detection device 30 is located around the column shaft 12. The torque detection device 30 is located closer to the steering component 2 than the worm wheel 23 of the assist device 20 in an axial direction of the column shaft 12. The torque detection device 30 detects a torque given to the column shaft 12 by an operation of the steering component 2. Hereinafter, the torque given to the column shaft 12 by the operation of the steering component 2 is referred to as a steering torque τ. The torque detection device 30 outputs a first detection signal S1 to the control device 90.

The compensation sensor 80 is located around the column shaft 12. The compensation sensor 80 is located closer to the steering component 2 than the torque detection device 30 in the axial direction of the column shaft 12. The compensation sensor 80 detects a magnetic flux passing through the compensation sensor 80. An example of the magnetic flux detected by the compensation sensor 80 is the earth's magnetism. The compensation sensor 80 outputs a second detection signal S2 to the control device 90.

The control device 90 performs an assist control. More specifically, the control device 90 calculates an assist force caused by the electric motor 21, based on the first detection signal S1 of the torque detection device 30, the second detection signal S2 of the compensation sensor 80, and a vehicle speed signal SV of a vehicle speed sensor 4. The control device 90 then assists steering of the steering component 2 based on the assist force.

An operation of the steering system 1 will be described. In the steering main body 10, the column shaft 12, the intermediate shaft 13, and the pinion shaft 14 rotate together due to the operation of the steering component 2. In the steering main body 10, the rotation of the pinion shaft 14 is converted to the reciprocating movement of the rack shaft 15 in its longitudinal direction by the rack-and-pinion mechanism 16. The steering main body 10 changes a steered angle of wheels 3 by the reciprocating movement of the rack shaft 15 via the two tie rods 17.

Figure 2:
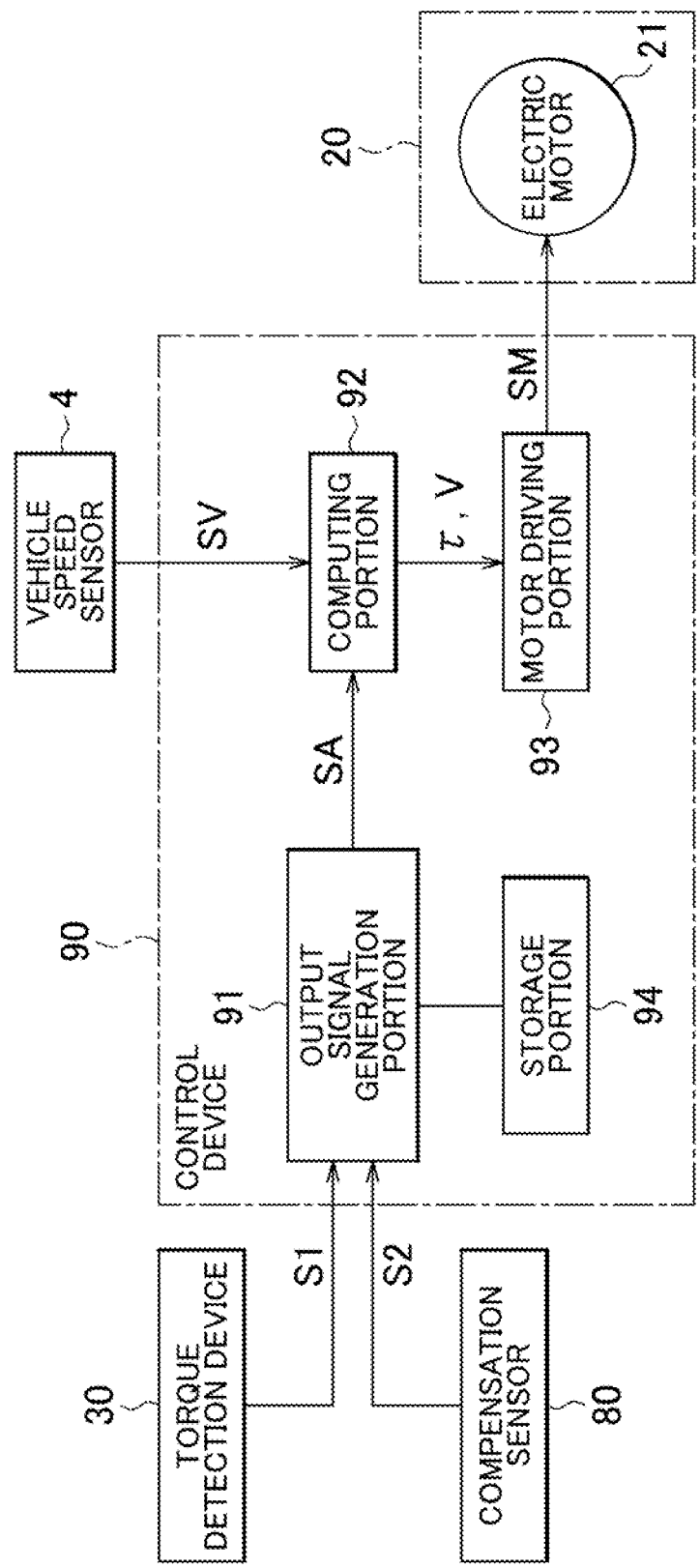
FIG. 2 is a block diagram showing the configuration of a control device according to the first embodiment.

Referring to FIG. 2, the configuration of the control device 90 will be described in detail. The control device 90 includes an output signal generation portion 91, a computing portion 92, a motor driving portion 93, and a storage portion 94.

The first detection signal S1 of the torque detection device 30 and the second detection signal S2 of the compensation sensor 80 are input to the output signal generation portion 91. The output signal generation portion 91 generates an output signal SA based on the detection signals S1, S2. The output signal generation portion 91 outputs the output signal SA to the computing portion 92.

The storage portion 94 stores therein a signal correction computing equation used by the output signal generation portion 91 to generate the output signal SA based on the detection signals S1, S2. The computing portion 92 computes a steering torque τ based on the output signal SA. The vehicle speed signal SV of the vehicle speed sensor 4 is input to the computing portion 92. The computing portion 92 computes a vehicle running speed V based on the vehicle speed signal SV. Hereinafter, the vehicle running speed will be referred to as a vehicle speed V. The computing portion 92 outputs the steering torque t and the vehicle speed V to the motor driving portion 93.

The motor driving portion 93 calculates a target value IG of a current supplied to the electric motor 21, based on the steering torque τ and the vehicle speed V. Hereinafter, the target value of the current supplied to the electric motor 21 will be referred to as a target current value IG. The motor driving portion 93 generates a motor driving signal SM based on the target current value IG. The motor driving portion 93 outputs the motor driving signal SM to a motor driving circuit (not shown) of the electric motor 21.

Figure 3:
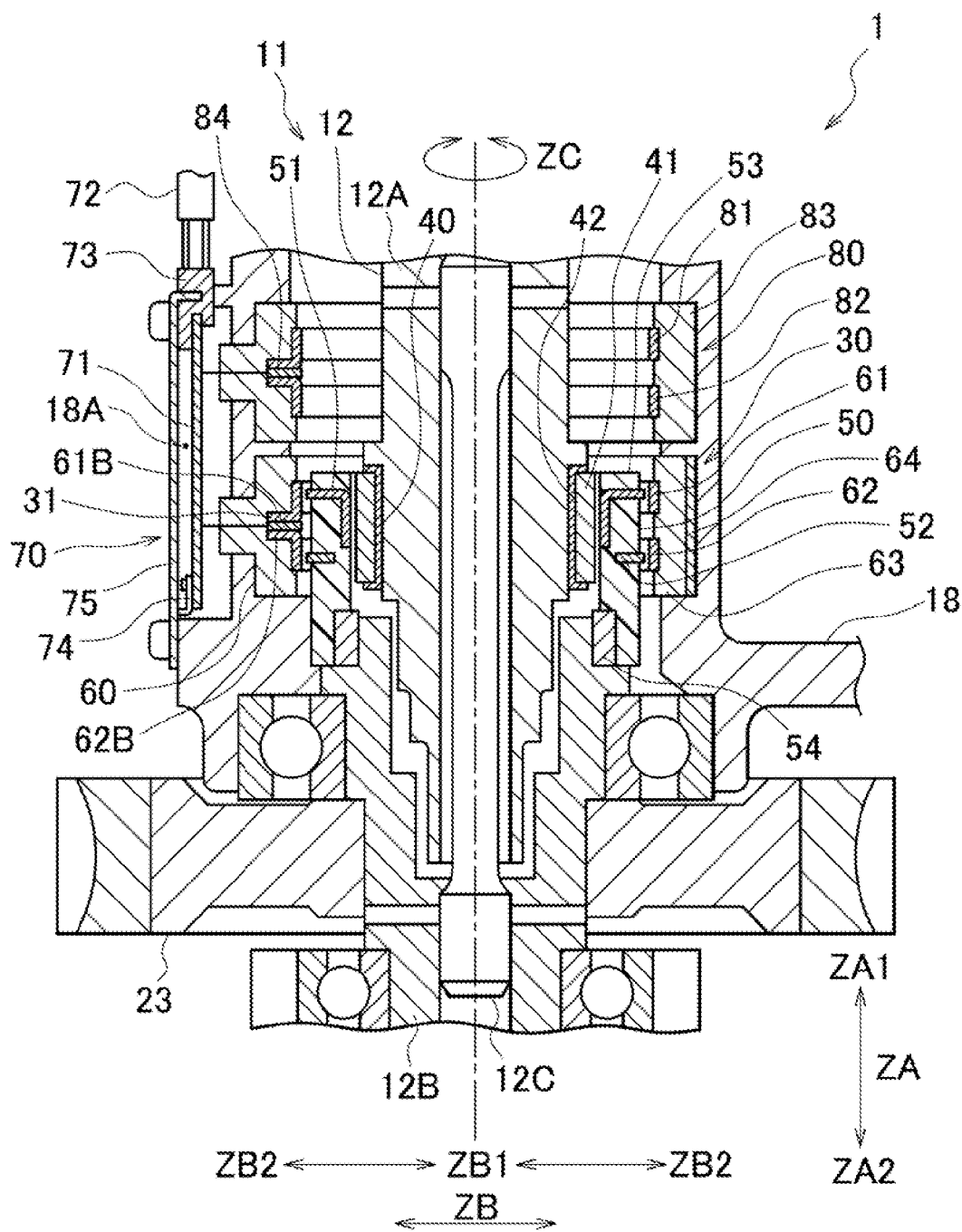
FIG. 3 is a sectional drawing showing a sectional structure of a torque detection device and portions around the torque detection device in the last embodiment.
Figure 4:
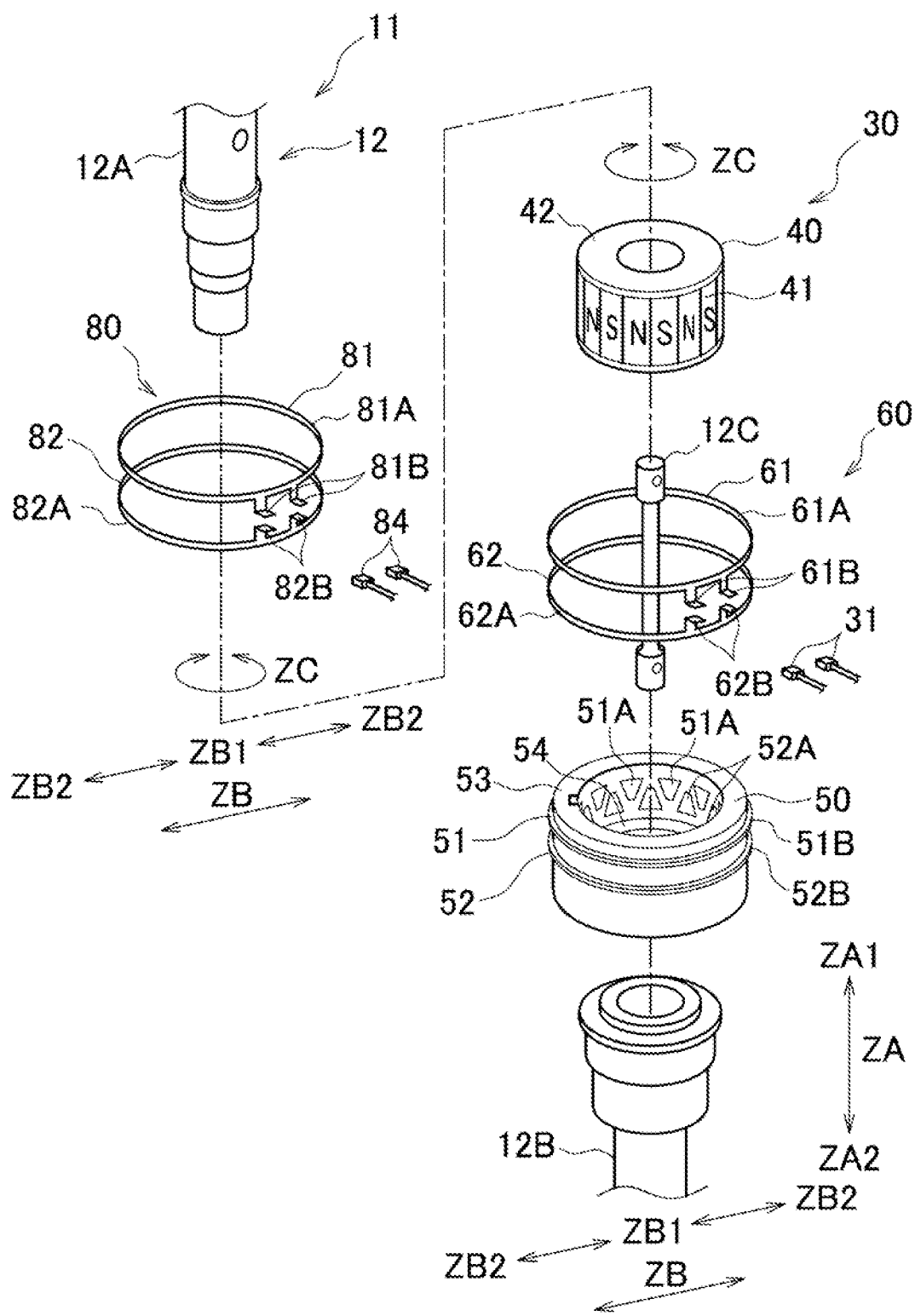
FIG. 4 is a perspective view showing the structures of portions of the torque detection device and portions of a compensation sensor in the first embodiment.

Referring to FIGS. 3 and 4, detailed configurations of the torque detection device 30 and the compensation sensor 80 will be described. As directions related to the steering system 1, an axial ZA, an upper direction ZA1, a lower direction ZA2, a radial direction ZB, an inward direction ZB1, an outward direction ZB2, and a circumferential direction ZC are defined.

The circumferential direction ZC indicates a direction around a rotational central axis of the column shaft 12. The axial direction ZA indicates a direction along the rotational central axis of the column shalt 12. The axial direction ZA is defined by the upper direction ZA1 and the lower direction ZA2 indicating directions opposite to each other. The upper direction ZA1 indicates a direction passing through the second shaft 12B and then the first shaft 12A in this order. The lower direction ZA1 indicates a direction passing through the first shaft 12A and then the second shaft 12B in this order.

The radial direction ZB indicates a direction of a normal to the axial direction ZA. The radial direction ZB is defined by the inward direction ZB1 and the outward direction ZB2 indicating directions opposite to each other. The inward direction ZB1 indicates a direction approaching to the rotational central axis of the column shaft 12. The outward direction ZB2 indicates a direction away from the rotational central axis of the column shaft 12.

As illustrated in FIG. 3, the torque detection device 30 includes two magnetic detection elements 31 as a magnetic detection portion, a magnet unit 40, a yoke unit 50, a magnetism collecting unit 60, and a circuit unit 70. In the torque detection device 30, a Hall IC is used as each of the magnetic detection elements 31.

Referring to FIG. 4, the magnet unit 40 includes a permanent magnet 41 and a core 42. The magnet unit 40 is fixed to the first shaft 12A. The permanent magnet 41 is magnetized such that N-poles and S-poles are alternately arranged in the circumferential direction ZC. The permanent magnet 41 forms a magnetic field around the permanent magnet 41. The core 42 is formed of a magnetic metal material. The core 42 has a cylindrical shape. The core 42 is fixed to an inner surface of the permanent magnet 41. The core 42 is pressed into the first shaft 12A.

The yoke unit 50 surrounds an outside of the magnet unit 40. The yoke unit 50 is disposed within the magnetic field formed by the permanent magnet 41. The yoke unit 50 includes a first yoke 51, a second yoke 52, a yoke holder 53, and a collar 54. The yoke unit 50 is fixed to the second shaft 12B.

As illustrated in FIG. 4, the first yoke 51 is formed of a magnetic metal material. The first yoke 51 has an annular shape. The first yoke 51 includes a plurality of yoke teeth 51A apart from each other in the circumferential direction ZC, and a connection portion 51B that connect the adjacent yoke teeth 51A in the circumferential direction ZC, to each other. The first yoke 51 has a configuration in which the yoke teeth 51A extend in the lower direction ZA2 beyond the connection portion 51B. Each of the yoke teeth 51A has a tapered shape in which as length in the circumferential direction ZC is reduced toward the lower direction ZA2.

The second yoke 52 is formed of a magnetic metal material. The second yoke 52 has an annular shape. The second yoke 52 includes a plurality of yoke teeth 52A apart from each other in the circumferential direction ZC, and a connection portion 52B that connects the adjacent yoke teeth 52A in the circumferential direction ZC, to each other. The second yoke 52 has a configuration in which the yoke teeth 52A extend in the upper direction ZA1 beyond the connection portion 52B. Each of the yoke teeth 52A has a tapered shape in which a size in the circumferential direction ZC is reduced toward the upper direction ZA1. Each of the yoke teeth 52A is disposed between the adjacent yoke teeth 51A in the circumferential direction ZC.

The yoke holder 53 is formed of a resin material. The yoke wilder 53 is formed integrally with the yokes 51, 52. The yoke holder 53 holds the yokes 51, 52. The collar 54 is fixed to end portion the yoke holder 53 in the lower direction ZA2. As illustrated in FIG. 3, the collar 54 is fixed to an end portion of the second shalt 12B in the upper direction ZA1.

The magnetism collecting unit 60 surround, an outside of the yoke unit 50. The magnetism collecting unit 60 is fixed to the column housing 18. The magnetism collecting unit 60 includes a first magnetism collecting ring 61, a second magnetism collecting ring 62, a magnetism collecting holder 63, and a magnetic shield 64. The magnetism collecting unit 60 collects a magnetic flux of each of the yokes 51, 52.

As illustrated in FIG. 4, the first magnetism collecting ring 61 is formed of a magnetic metal material. The first magnetism collecting ring 61 includes a ring main body 61A and two magnetism collecting projections 61B. The ring main body 61A has an annular shape. The magnetism collecting projections 61B extend in the outward direction ZB2 from a lower end portion of the ring main both 61A. The magnetism collecting projections 61B are adjacent to each other in the circumferential direction ZC, with as gap being interposed therebetween.

The second magnetism collecting ring 62 is formed of as magnetic metal material. The second magnetism collecting ring 62 includes a ring main body 62A and two magnetism collecting projections 62B. The ring main body 62A has the same shape as the shape of the ring main body 61A. The magnetism collecting projections 62B extend in the outward direction ZB2 from an upper end portion of the ring main body 62A. The magnetism collecting projections 62B are opposed to the magnetism collecting projections 61B in the axial direction ZA.

As illustrated FIG. 3, the magnetism collecting holder 63 is formed of a resin material. The magnetism collecting holder 63 has an annular shape. The magnetism collecting holder 63 is formed integrally with the magnetism collecting rings 61, 62. The magnetism collecting holder 63 holds the magnetism collecting rings 61, 62.

The magnetic shield 64 is formed of a magnetic metal material. The magnetic shield 64 has an arc shape in a plan view in the axial direction ZA. The magnetic shield 64 is fixed to an outer peripheral surface of the magnetism collecting holder 63. The magnetic shield 64 covers the magnetism collecting rings 61, 62 from an outer side in the radial direction ZB. The magnetic shield 64 does not cover the magnetic detection elements 31 from an outer side in the radial direction ZB.

In FIG. 4, the two magnetic detection elements 31 are adjacent to each other in the circumferential direction ZC. The magnetic detection elements 31 detect the magnetic flux of a magnetic circuit formed by the permanent magnet 41, the yokes 51, 52, and the magnetism collecting rings 61, 62. The magnetic detection elements 31 are located between the magnetism collecting projections 61B, 62B in the axial direction ZA.

In FIG, 3, the circuit unit 70 includes a circuit substrate 71, a cable 72, a bush 73, a substrate holding portion 74, and a substrate cover component 75. The circuit unit 70 communicates the first detection signal S1 of the magnetic detection elements 31 and the second detection signal S2 of magnetic detection elements 84 of the compensation sensor 80 to the control device 90 illustrated in FIGS. 1 and 2.

The magnetic detection elements 31, 84 are electrically connected to the circuit substrate 71. The circuit substrate 71 is opposed to the magnetism collecting unit 60 and the compensation sensor 80 across a gap in the radial direction ZB. The cable 72 electrically connects the circuit substrate 71 to the control device 90. The cable 72 is connected to an upper end portion of the circuit substrate 71 via the bush 73.

The bush 73 is formed of a rubber material. The cable 72 is inserted into the hush 73. The bush 73 is sandwiched between an upper end portion of a substrate accommodating portion 18A of the column housing 18 and the substrate cover component 75.

The substrate holding portion 74 holds the circuit substrate 71 by fastening the circuit substrate 71 to the substrate cover component 75. The substrate cover component 75 covers the circuit substrate 71 and the substrate accommodating portion 18A of the column housing 18 from an outer side in the direction ZB. The substrate cover component 75 is fixed to an end portion of the substrate accommodating portion 18A in the outward direction ZB2.

The compensation sensor 80 includes a first magnetism collecting ring 81, as second magnetism collecting ring 82, a magnetism collecting holder 83, and the two magnetic detection elements 84. In the compensation sensor 80, a Hall IC is used as each of the magnetic detection elements 84, similarly to the magnetic detection elements 31.

As illustrated in FIG. 4, the first magnetism collecting ring 81 includes a ring main body 81A and two magnetism collecting projections 81B. As the first magnetism collecting ring 81 the same component as the first magnetism collecting ring 61 of the torque detection device 30 is used. The second magnetism collecting ring 82 includes a ring main body 82A and two magnetism collecting projections 82B. As the second magnetism collecting ring 82, the same component as the second magnetism collecting ring 62 of the torque detection device 30 is used. As the magnetism collecting holder 83, the same component as the magnetism collecting holder 63 of the torque detection device 30 is used. The magnetic detection elements 84 are located between the magnetism collecting projections 81B, 82B in the axial direction ZA, similarly to the magnetic detection elements 31.

Figure 5C:
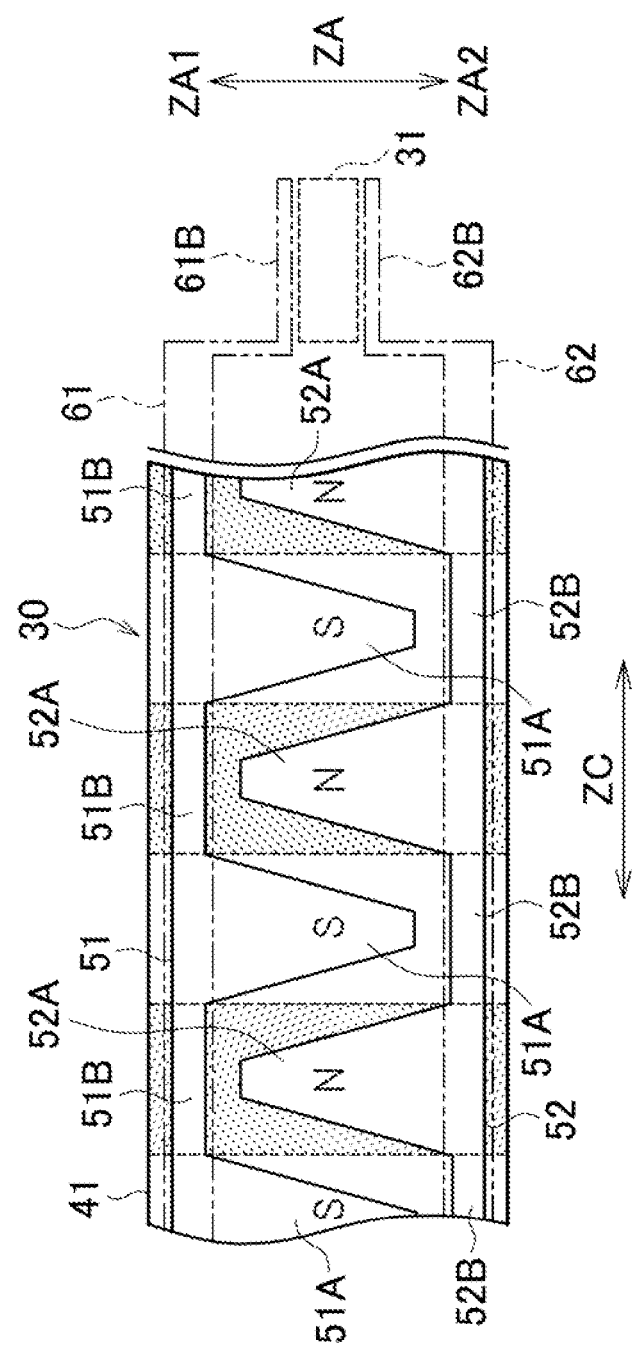
FIG. 5C is a development view showing the positional relationship between the permanent magnet, and each yoke and each magnetism collecting ring in the torque detection device at a counter-clockwise rotation state in the first embodiment.

Referring to FIGS. 5A to 5C, detection of a magnetic flux by the torque detection device 30 will be described. FIG. 5A illustrates a state in which a torque is not applied between the first shaft 12A and the second shaft 12B illustrated in FIG. 1 (hereinafter referred to as a neutral state). FIG. 5B illustrates a state in which a clockwise torque is applied between the first shaft 12A and the second shaft 12B (hereinafter referred to as a clockwise rotation state). FIG. 5C illustrates as state in which a counter-clockwise torque is applied between the first shaft 12A and the second shaft 12B (hereinafter referred to as a counter-clockwise rotation state).

As a relationship between each of the yokes 51, 52 and the permanent magnet 41, a first N-pole opposed area, a first S-pole opposed area, a second N-pole opposed area, and a second S-pole opposed area are defined. The first N-pole opposed area indicates an opposed area in which the first yoke 51 and the N-pole of the permanent magnet 41 are opposed to each other. The first S-pole opposed area indicates an opposed area in which the first yoke 51 and the S-pole of the permanent magnet 41 are opposed to each other. The second N-pole opposed area indicates an opposed area in which the second yoke 52 and the N-pole of the permanent magnet 41 are opposed to each other. The second. S-pole opposed area indicates an opposed area in winch the second yoke 52 and the S-pole of the permanent magnet 41 are opposed to each other.

As illustrated in FIG. 5A, in the neutral state, a tip portion of the yoke tooth 51A of the first yoke 51 is located at a boundary portion between the N-pole and the S-pole of the permanent magnet 41, and a tip portion of the yoke tooth 52A of the second yoke 52 is also located at the boundary portion. At this time, the first N-pole opposed area and the first S-pole opposed area are equal to each other. Further, the second N-pole opposed area and the second S-pole opposed area are equal to each other. Thus, no magnetic flux occurs between the magnetism collecting projections 61B of the first magnetism collecting ring 61 and the magnetism collecting projections 62B of the second magnetism collecting ring 62. Accordingly, an output voltage of the magnetic detection elements 31 indicates zero.

As illustrated in FIG. 5B, in the clockwise rotation state, torsion occurs in the torsion bar 12C illustrated in FIG 1, and therefore, a relative position of each of the yokes 51, 52 with respect to the permanent magnet 41 varies. Thus, the first N-pole opposed area becomes larger than the first S-pole opposed area. Further, the second N-pole opposed area becomes smaller than the second S-pole opposed area. Accordingly, the amount of a magnetic flux entering the first yoke 51 from the N-pole of the permanent magnet 41 is larger than the amount of a magnetic flux emitted from the first yoke 51 to the S-pole of the permanent magnet 41. Further, the amount of a magnetic flux entering the second yoke 52 from the N-pole of the permanent magnet 41 is smaller than the amount of a magnetic flux emitted from the second yoke 52 to the S-pole of the permanent magnet 41. Therefore, a magnetic flux flows from the magnetism collecting projections 61B of the first magnetism collecting ring, 61 to the magnetism collecting projections 62B of the second magnetism collecting ring 62. The magnetic detection elements 31 output the output voltage according to this magnetic flux as the first detection signal S1.

As illustrated in FIG. 5C, in the counter-clockwise rotation state, torsion occurs in the torsion bar 12C in a direction opposite to that in the clockwise rotation state, and therefore, the relative position of each of the yokes 51, 52 with respect to the permanent magnet 41 changes in the direction opposite to that in the clockwise rotation state. Thus, the first N-pole opposed area becomes smaller than the first S-pole opposed area. Further, the second N-pole opposed area becomes larger than the second S-pole opposed area. Accordingly, the amount of a magnetic flux entering the first yoke 51 from the N-pole of the permanent magnet 41 is smaller than the amount of a magnetic flux emitted from the first yoke 51 to the S-pole of the permanent magnet 41. Further, the amount of a magnetic flux entering, the second yoke 52 from the N-pole of the permanent magnet 41 is larger than the amount of a magnetic flux entering the S-pole of the permanent magnet 41 from the second yoke 52. Accordingly, a magnetic flux flows from the magnetism collecting projections 62B of the second magnetism collecting ring 62 to the magnetism collecting projections 61B of the first magnetism collecting ring 61. The magnetic detection elements 31 output the output voltage according to this magnetic flux as the first detection signal S1.

Referring now to FIG. 4, detection of a magnetic flux by the compensation sensor 80 will be described. The earth's magnetism and a magnetic flux of a device other than the compensation sensor 80, such as the electric motor 21 illustrated in FIG. 1, pass through the first magnetism collecting ring 81 and the second magnetism collecting ring 82 via the column shaft 12. Based on a difference between the magnetic flux amount of the first magnetism collecting ring 81 and the magnetic flux amount of the second magnetism collecting ring 82, a magnetic flux flows between the magnetism collecting projections 81B of the first magnetism collecting ring 81 and the magnetism collecting projections 82B of the second magnetism collecting ring 82. The magnetic detection elements 84 output an output voltage according to this magnetic flux as the second detection signal S2, Referring now to FIG. 6, an operation of the steering system 1 will be described. Note that in the following description referring to FIG. 6, constituent elements related to the steering system 1, to which reference signs are assigned, indicate the constituent elements shown in FIG. 1 or FIG, 2.

Further, a configuration, in which the amount of a current supplied to the electric motor 21 is calculated based on the first detection signal S1 and the vehicle speed V, is described as a comparative steering system CS. Further, a traveling direction of a vehicle provided with the steering system 1 is described as a vehicle traveling direction.

Figure 6:
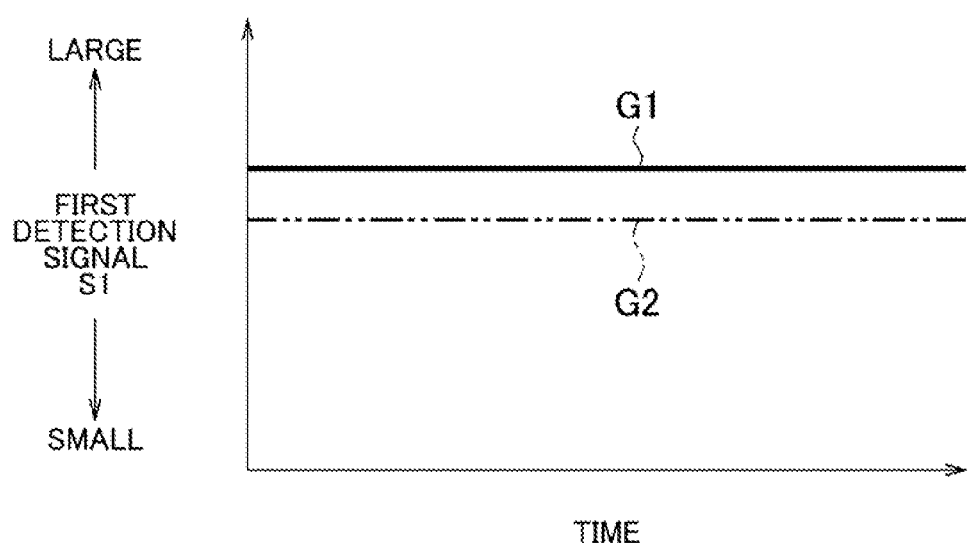
FIG. 6 is a graph showing a change in a first detection signal a the torque detection device in the first embodiment.

A graph GI shown by a continuous line in FIG. 6 indicates the first detection signal S1 of the torque detection device 30 at the time when a steering torque set in advance thereinafter referred to as a set steering torque) is applied to the column shall 12, in a case where the vehicle traveling direction is a direction toward the north. A graph G2 shown by an alternate long and two short dashes line in FIG. 6 indicates the first detection signal S1 of the torque detection device 30 at the time when the set steering torque is applied to the column shaft 12, in a case where the vehicle traveling direction is a direction toward the south.

Value of the earth's magnetism varies depending on the vehicle traveling direction. In view of this, as shown by the graphs G1, G2, a magnitude of the first detection signal S1 of the torque detection device 30 varies depending on the vehicle traveling direction. Further, the value of the earth's magnetism varies depending on a region defined by a range surrounded by a predetermined latitude and a predetermined longitude.

In the comparative steering system CS, the amount of the current supplied to the electric motor of the comparative steering system CS is calculated based on the first detection signal S1. Therefore, the amount of the current supplied to the electric motor varies depending on the vehicle traveling direction and the region. Accordingly, in the comparative steering system CS, its assist force varies depending on the vehicle traveling direction and the region. Therefore, in the comparative steering system CS, a steering feel may vary depending on the vehicle traveling direction and the region.

In addition, the magnetic flux generated by the device other than the torque detection device 30, such as the electric motor 21, may affect the torque detection device 30. The magnetic flux generated by the device other than the torque detection device 30, such as the electric motor 21, will be hereinafter referred to as an external magnetic flux. In the torque detection device 30, the magnitude of the first detection signal S1 varies depending on whether there is the external magnetic flux or not. Therefore, in the comparative steering system CS, the steering feel may vary depending on whether there is the external magnetic flux or not, as well as depending on the earth's magnetism. A magnetic field caused by the earth's magnetism and a magnetic field caused by the external magnetic flux will be hereinafter collectively referred to as an external magnetic field.

In contrast, in the steering system 1 according to the present embodiment, a magnetic flux of the external magnetic field is detected by the compensation sensor 80. In the steering system 1, the output signal SA, in which an influence of the external magnetic field is reduced, is generated by the output signal generation portion 91 of the control device 90 as follows.

That is, the output signal generation portion 91 generates the output signal SA from the first detection signal. S1 and the second detection signal S2 with use of the signal correction computing equation stored in the storage portion 94.

The signal correction computing equation is the following equation 1. In the equation 1, k indicates a gain. The value of k is set in advance through experiment or the like.

$$SA = S1 - k \times S2 \tag{1}$$

The output signal SA is to signal generated by reducing, in the first detection signal S1, the influence of the external magnetic field based on the second detection signal S2, according to the signal correction computing equation. Note that since the torque detection device 30 and the compensation sensor 80 are disposed at different positions, the magnetic flux amount of the external magnetic field, which is detected by the second detection signal S2, is different from the magnetic flux amount of the external magnetic field, which is included in the first detection signal S1 of the torque detection device 30. In view of this, information on correlation between the magnetic flux amount of the external magnetic field detected by the second detection signal S2, and the magnetic flux amount of the external magnetic field included in the first detection signal S1 of the torque detection device 30 is obtained in advance through experiment or the like. Then, the value of k, that is, the magnitude of the gain is set based on this information on the correlation.

Then, in the steering system 1, the amount of the current supplied to the electric motor 21 is calculated based on the output signal SA and the vehicle speed V. This prevents a situation in which the amount of the current supplied to the electric motor varies depending on the vehicle traveling direction and depending, on whether there is the external magnetic flux or not. This accordingly prevents a situation in which the steering feel varies depending on the vehicle traveling direction and depending on whether there is the external magnetic flux or not.

The steering system 1 according to the present embodiment has the following advantageous effects 1) to 3).

1) The steering system 1 includes the compensation sensor 80. In the steering system 1, the output signal SA, in which the influence of the external magnetic field is reduced, is generated based on the first detection signal S1 of the torque detection device 30 and the second detection signal S2 of the compensation sensor 80. In the steering system 1, the electric motor 21 of the assist device 20 is driven based on the output signal SA. With this configuration, the steering system 1 is able to operate in a state where the influence of the external magnetic field is further reduced. This accordingly prevents a situation in which the steering feel varies due to the influence of the magnetic field.

2) In the circuit substrate 71 of the torque detection device 30, the magnetic detection elements 31 are electrically connected to the magnetic detection elements 84 of the compensation sensor 80. With this configuration, the magnetic detection elements 31, 84 are electrically connected to the common circuit substrate 71. Accordingly, the number of components of the steering system 1 is reduced in comparison with a hypothetical configuration in which the magnetic detection elements 31, 84 are electrically connected to individual circuit substrates.

3) The compensation sensor 80 is constituted by the components that are the same as the components of the magnetism collecting unit 60 of the torque detection device 30. With this configuration, the number of types of components of the steering system 1 is reduced in comparison with a hypothetical configuration in which the components of the compensation sensor 80 are different from the components of the magnetism collecting unit 60 of the torque detection device 30.

Figure 7:
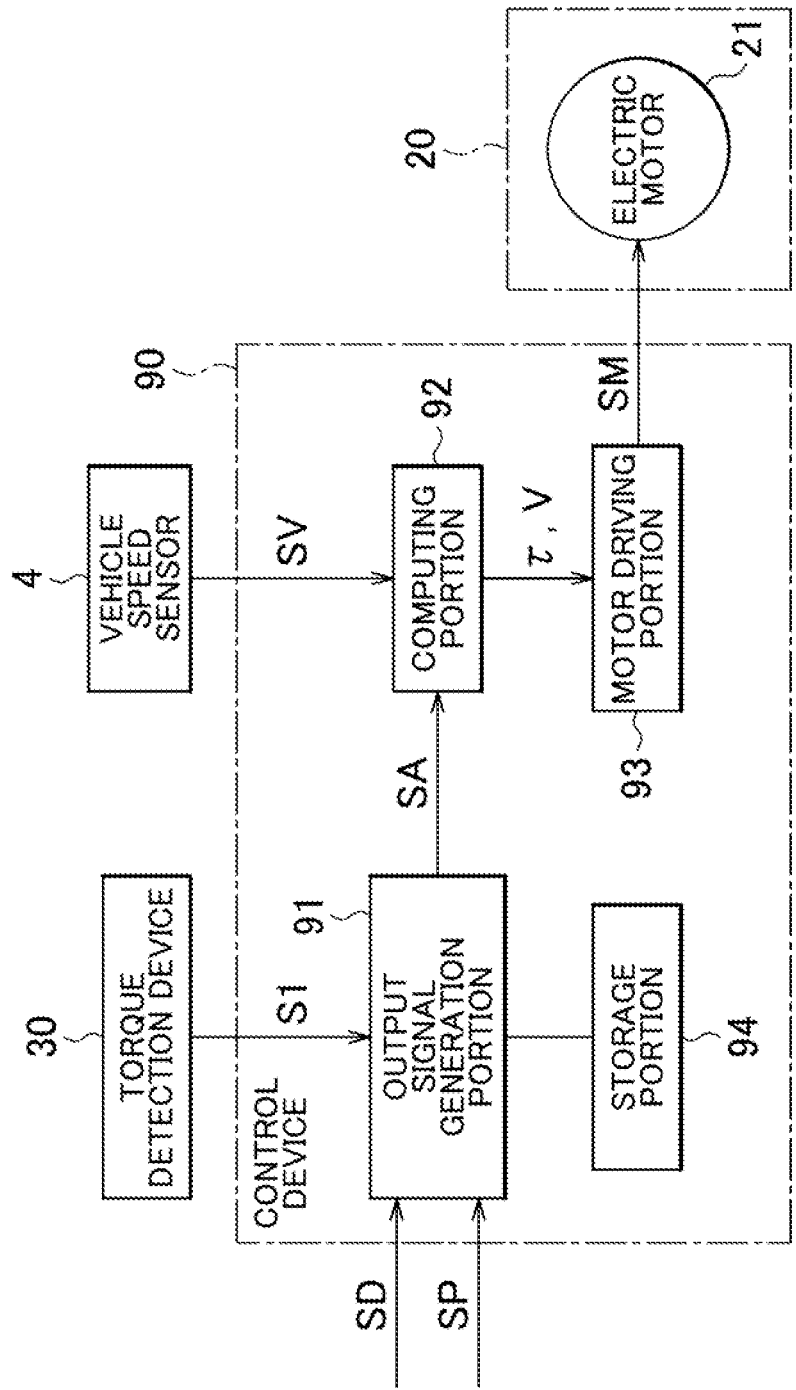
FIG. 7 is a block diagram showing the configuration of as control device of a steering system according to a second embodiment of the invention.

The configuration of a steering system 2 according to a second embodiment of the invention is illustrated in FIG. 7. The steering system 2 according to the present embodiment is mainly different from the steering system 1 according to the first embodiment illustrated in FIGS. 1 and 2 in the following point. That is, the steering system 2 according to the second embodiment does not include the compensation sensor 80. The following description deals with details of the different point from the steering system 1 according to the first embodiment, and the same configurations as in the first embodiment have the same reference signs as in the first embodiment, and description thereof will be partially or fully omitted.

A vehicle direction signal SD and a vehicle position signal SP of a GPS measurement portion provided in a vehicle are input to the control device 90. The GPS measurement portion is omitted in FIG. 7. The GPS measurement portion receives a GPS signal transmitted from a GPS satellite every predetermined period. The GPS measurement portion generates the vehicle position signal SP indicating a latitude and a longitude of the vehicle based on the GPS signal. The GPS measurement portion generates the vehicle direction signal SD as a signal indicating in which direction the vehicle travels, based on a GPS signal received in a previous period and a GPS signal received in a present period.

Figure 8:
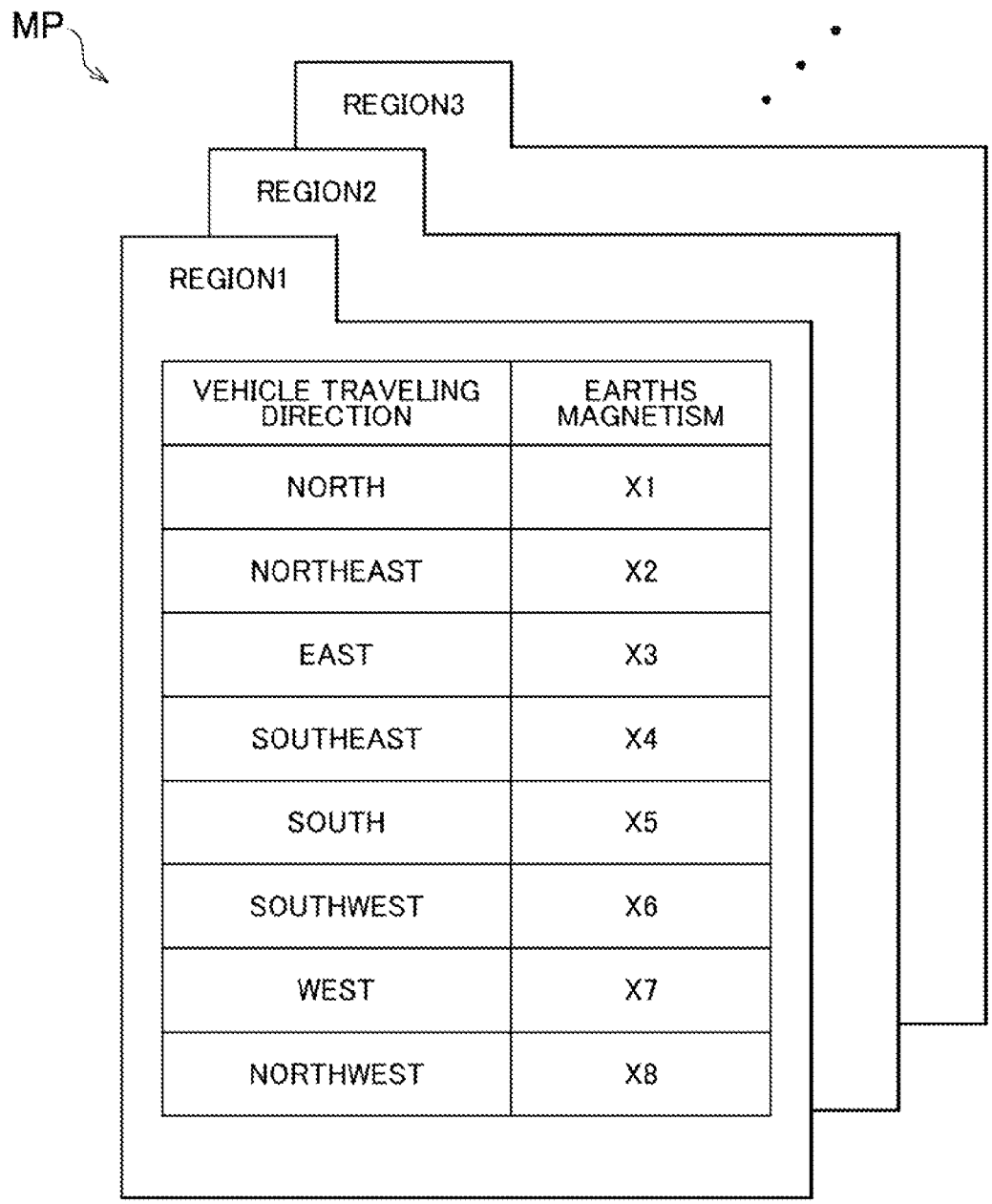
FIG. 8 is as map showing a relationship between a vehicle traveling direction and earth's magnetism in each region, the relationship being stored in the control device according to the second embodiment.

The storage portion 94 stores therein a map MP indicating a relationship between a vehicle traveling direction and the earth's magnetism in each of regions, as a correction value table. As illustrated in FIG. 8, the map MP shows values of the earth's magnetism corresponding to eight directions, i.e., the north, the northeast, the east, the southeast, the south, the southwest, the west, and the northwest, as the vehicle traveling directions. The map MP is divided into maps for respective regions, e.g., maps for respective provinces. Note that the value of the earth's magnetism in the map MP corresponds to the earth's magnetism included in the first detection signal S1 of the torque detection device 30 illustrated in FIG. 7. The value of the earth's magnetism is a positive value or a negative value based on a direction of the earth's magnetism. The values of the earth's magnetism are set in advance through experiment or simulation or the like.

As illustrated in FIG. 7, the first detection signal S1 of the torque detection device 30, the vehicle direction signal SD, and the vehicle position signal SP are input to the output signal generation portion 91. The output signal generation portion 91 generates an output signal SA based on the first detection signal S1 and the map MP. The output signal generation portion 91 outputs the output signal SA to the computing portion 92.

A method of generating the output signal SA by the output signal generation portion 91 will be described. The output signal generation portion 91 selects a region in the map MP based on the vehicle position signal SP. Then, the output signal generation portion 91 selects the value of the earth magnetism corresponding to a vehicle traveling direction in the selected region in the map MP, based on the vehicle direction signal SD. The output signal generation portion 91 generates the output signal SA by subtracting a correction value for S1 corresponding to the value of the earth's magnetism from the value of the first detection signal S1. The computing portion 92 and the motor driving portion 93 operate in a manner similar to a manner in which the computing portion 92 and the motor driving portion 93 operate in the first embodiment.

The steering system 2 according to the present embodiment has the following effect 4), in addition to an effect similar to the effect 1) of the steering system 1 according to the first embodiment.

4) In the steering system 2, the output signal SA is generated based on the map MP and the first detection signal S1. Then, in the steering system 2, the electric motor 21 is driven based on the output signal SA. With this configuration, the steering system 2 does not include the compensation sensor 80 in the first embodiment. Thus, the number of components of the steering system is reduced.

The steering system according to the invention may be realized in embodiments other than the aforementioned embodiments. Hereinafter, modified examples of the above embodiments as the other embodiments of the steering system according to the invention will be described. Note that the following modified examples may be employed in combination.

The compensation sensor 80 according to the first embodiment is adjacent to the torque detection device 30 in the axial direction ZA such that the compensation sensor 80 is located, on an upper-direction-ZA1 side of the torque detection device 30 in the axial direction ZA. However, the position of the compensation sensor 80 is not limited to the position as exemplified in the first embodiment. For example, the compensation sensor 80 according to a modified example is adjacent to the torque detection device 30 in the axial direction ZA such that the compensation sensor 80 is located on a lower-direction ZA2 side of the torque detection device 30 in the axial direction ZA. Further, the compensation sensor 80 according to another modified example is located outside a column housing 18.

The compensation sensor 80 according to the first embodiment includes the two magnetic detection elements 84. However, the configuration of the compensation sensor 80 is not limited to the configuration exemplified in the first embodiment. For example, the compensation sensor 80 according to a modified example includes one magnetic detection element 84.

In the compensation sensor 80 according to the first embodiment, the Hall IC is used as each of the magnetic detection elements 84. However, the configuration of the magnetic detection elements 84 is not limited to the configuration exemplified in the first embodiment. For example, as the magnetic detection element 84 according to a modified example, a Hall element or an MR element is used instead of the Hall IC.

In the compensation sensor 80 according to the first embodiment, the magnetism collecting rings 81, 82 and the magnetism collecting holder 83 are configured as the components that are the same as the components of the magnetism collecting unit 60. However, the configuration of the compensation sensor 80 is not limited to the configuration exemplified in the first embodiment For example, in the compensation sensor 80 according to a modified example, the magnetism collecting rings 81, 82 and the magnetism collecting holder 83 are configured as components different from the magnetism collecting rings 61, 62 and the magnetism collecting holder 63 of the magnetism collecting unit 60.

In the compensation sensor 80 according to the first embodiment, a magnetic shield may be attached to an outer peripheral surface of the magnetism collecting holder 83. The magnetic shield is formed of a magnetic metal material.

In the control device 90 according! to the first embodiment, the output signal generation portion 91 may be omitted. In this case, the output signal generation portion 91 is formed as a microcomputer provided on the circuit substrate 71 of the circuit unit 70 of the torque detection device 30. Note that the control device 90 according to the second embodiment may he modified in a similar manner.

In the control device 90 according, to the first embodiment, the output signal generation portion 91 generates the output signal SA from the detection signals S1, S2 based on the signal correction computing equation. However, the method of generating the output signal SA by the control device 90 is not limited to the method exemplified in the first embodiment. For example, the control device 90 according to a modified example calculates the magnetic flux amount of the external magnetic field in the first detection signal S1 based on a map showing a relationship between the magnetic flux amount of the external magnetic field in the first detection signal S1 and the magnetic flux amount of the external magnetic field in the second detection signal S2, instead of using the signal correction computing equation. Further, the control device 90 according to the modified example generates the output signal SA by excluding, from the first detection signal S1, a signal correction amount corresponding to the calculated magnetic flux amount of the external magnetic field in the first detection signal S1.

The map NIP according to the second embodiment includes eight directions as the vehicle traveling directions. However, the number of vehicle traveling directions is not limited to the number of vehicle traveling directions exemplified in the second embodiment. For example, the map MP according to a modified example includes a plurality of directions, e.g., nine directions or more or seven directions or less, as the vehicle traveling directions.

In the map MP according to the second embodiment, the regions are determined so as to correspond to respective prefectures. However, the method of determining the regions is not limited to the method exemplified in the second embodiment. For example, in the map MP according to a modified example, each region is determined based on a range of a city, a town or a village in a province. Further, in the map MP according to another modified example, each region is determined based on an area defined by a predetermined latitude range and a predetermined longitude range.

The vehicle direction signal SD and the vehicle position signal SP generated by the GPS measurement portion in the vehicle are input to the control device 90 according to the second embodiment. The vehicle direction signal SD and the vehicle position signal SP input to the control device 90 are not limited to the vehicle direction signal SD and the vehicle position signal SP exemplified in the second embodiment. For example, the vehicle direction signal SD and the vehicle position signal SP generated by a navigation device are input to the control device 90 according to a modified example.

The vehicle direction signal SD and the vehicle position signal SP of the GPS measurement portion of the vehicle are input to the control device 90 according to the second embodiment. However, the configuration of the control device 90 is not limited to the configuration exemplified in the second embodiment. For example, the control device 90 according to a modified example includes a receiving portion that receives a GPS signal. The control device 91) according to the modified example generates the vehicle direction signal SD and the vehicle position signal SP based on the UPS signal received by the receiving; portion. The control device 90 according to the modified example then outputs the vehicle direction signal SD and the vehicle position signal SP to the output signal generation portion 91.

The control device 90 according, to the second embodiment may be configured such that the vehicle position signal SP is not input to the control device 90. In this case, the map MP is not divided into maps for respective regions. The map MP shows a relationship between the vehicle traveling direction and the earth's magnetism. That is, in the control device 90, the common map MP is used any region.

Each of the torque detection devices 30 according to the first and second embodiments includes the two magnetic detection elements 31. However, the configuration of the torque detection device 30 is not limited to the configuration exemplified in each embodiment. For example, a torque detection device 30 according to a modified example includes one magnetic detection element 31.

In each of the torque detection devices 30 according to the first and second embodiments, the Hall IC is used as each of the magnetic detection elements 31. However, the configuration of the magnetic detection element 31 is not limited to the configuration exemplified in each embodiment. For example, as the magnetic defection element 31 according to a modified example, a Hall element or an MR element is used instead of the Hall IC.

In each of the torque detection devices 30 according to the first and second embodiments, the magnetic shield 64 may be omitted. Each of the steering systems 1, 2 according to the first and second embodiments includes the torque detection device 30 as the magnetic detection device. However, the configuration of the magnetic detection device is not limited to the configuration exemplified in each embodiment. For example, the steering system 1 according to a modified example includes a steering angle detection device in addition to the torque detection device 30, as the magnetic detection device. The steering angle detection device outputs, to the control device 90, a steering angle that is a rotation angle of a steering shaft 11, as a first detection signal. Further, the steering system 1 according to another modified example includes a steering angle detection device as the magnetic detection device, instead of the torque detection device 30, Each of the steering systems 1, 2 according to the first and second embodiments has the configuration as the column assist type electric power steering system. However, the configuration of each of the steering systems 1, 2 is not limited to the configuration exemplified in each embodiment. For example, the steering system 1 according to it modified example may have a configuration as an electric power steering system of a pinion assist type, a dual pinion assist type, as rack parallel type, or a rack coaxial type.

Technical ideas A), B) that can be understood from the above embodiments will be described, together with effects.

A) A steering system including a circuit unit that electrically connects the torque detection device to the control device, wherein the circuit unit includes a circuit substrate, and the torque detection device and the compensation sensor are electrically connected to the circuit substrate.

With this configuration, the torque detection device and the compensation sensor are electrically connected to the common circuit substrate.

Accordingly, the number of components of the steering system is reduced in comparison with a hypothetical configuration in which the torque detection device and the compensation sensor are electrically connected to individual circuit substrates.

B) A steering system in which the torque detection device includes a magnetism collecting ring that surrounds an outside of the yoke and a magnetism collecting holder that holds the magnetism collecting ring, and the compensation sensor includes a magnetism collecting ring that is the same component as the magnetism collecting ring of the torque detection device, and a magnetism collecting holder that is the same component as the magnetism collecting holder of the torque detection device.

With this configuration, the magnetism collecting ring and the magnetism collecting holder of the torque detection device are the same components as the magnetism collecting ring and the magnetism collecting holder of the compensation sensor. Therefore, the number of types of the components of the steering system is reduced in comparison with a hypothetical configuration in which the magnetism collecting ring and the magnetism collecting holder of the torque detection device are components different from the magnetism collecting ring and the magnetism collecting holder of the compensation sensor.

What is claimed is:
1. A steering system comprising:
a steering shaft that rotates due to an operation of a steering component;
an electric motor that assists the operation of the steering component by applying, to the steering shaft, a force that rotates the steering shaft;
a permanent magnet that rotates together with the steering shaft;
a yoke disposed in a magnetic field formed by the permanent magnet such that a relative position of the yoke with respect to the permanent magnet varies;

a magnetic detection device including a magnetic detection portion that generates a first detection signal according to a magnetic flux of a magnetic circuit formed by the permanent magnet and the yoke;

an output signal generation portion that generates, based on the first detection signal and an external magnetic field including earth's magnetism, an output signal by reducing an influence of the external magnetic field in a first detection signal; and a motor driving portion that drives the electric motor based on the output signal.

2. The steering system according to claim 1, further comprising:

a compensation sensor that generates a second detection signal according to a magnetic flux of the external magnetic field, wherein the output signal generation portion generates the output signal by reducing the influence of the external magnetic field in the first detection signal, with use of a signal correction computing equation based on information on correlation between the first detection signal and the second detection signal, or with use of a map based on the information on the correlation between the first detection signal and the second detection signal.

3. The steering system according to claim 1, wherein the output signal generation portion includes a correction value table indicating a relationship between a direction of a vehicle and the earth's magnetism, and the output signal generation portion determines a value of the earth's magnetism with use of the correction value table and a vehicle direction signal indicating the direction of the vehicle, and generates the output signal by reducing an influence of the earth's magnetism in the first detection signal.

4. The steering system according to claim 1, wherein the magnetic detection device is a torque detection device that detects a steering torque applied to the steering shaft, or a steering angle detection device that detects a steering angle that is at rotation angle of the steering shaft.

5. The steering system according to claim 2, wherein the magnetic detection device is a torque detection device that detects a steering torque applied to the steering shaft, or a steering angle detection device that detects a steering angle that is a rotation angle of the steering shaft.

6. The steering system according to claim 3, wherein the magnetic defection device is a torque detection device that detects a steering torque applied to the steering shaft, or as steering angle detection device that detects a steering angle that is a rotation angle of the steering shaft.

\* \* \* \* \*